(12) United States Patent
Chen et al.

(10) Patent No.: US 10,401,399 B2
(45) Date of Patent: Sep. 3, 2019

(54) LOW-POWER VOLTAGE DETECTION CIRCUIT

(71) Applicant: NUVOTON TECHNOLOGY CORPORATION, Hsinchu (TW)

(72) Inventors: Po-Sheng Chen, Hsinchu (TW); Te-Ming Tseng, Hsinchu (TW); Yeh-Tai Hung, Hsinchu (TW)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 110 days.

(21) Appl. No.: 15/860,945

(22) Filed: Jan. 3, 2018

(65) Prior Publication Data

US 2019/0072588 A1    Mar. 7, 2019

(30) Foreign Application Priority Data

Sep. 7, 2017  (TW) .............................. 106130680 A

(51) Int. Cl.
| | | |
|---|---|---|
| *G01R 19/165* | (2006.01) | |
| *H03K 17/22* | (2006.01) | |
| *G01R 19/155* | (2006.01) | |
| *H03K 21/38* | (2006.01) | |

(52) U.S. Cl.
CPC ..... *G01R 19/16519* (2013.01); *G01R 19/155* (2013.01); *H03K 17/223* (2013.01); *H03K 21/38* (2013.01)

(58) Field of Classification Search
CPC .... H03K 17/223; H03K 17/145; H03K 17/22; H03K 17/302; H03K 3/0375; H03K 5/08; H03K 21/38; G01R 19/16552; G01R 31/31719; G01R 15/142; G01R 19/16538; G01R 19/16542; G01R 21/10; G01R 21/14; G01R 31/36; G01R 31/3648; G01R 19/155; G01R 19/16519; G01R 19/16576; G01R 19/25; H02M 2001/0009; H02M 3/157; H02M 2001/0032
See application file for complete search history.

(56) References Cited

U.S. PATENT DOCUMENTS

| | | | | | |
|---|---|---|---|---|---|
| 4,296,338 | A | * | 10/1981 | Thomas | ............... H03K 17/223 327/393 |
| 5,778,238 | A | * | 7/1998 | Hofhine | ................. G11C 5/143 713/340 |
| 6,005,423 | A | * | 12/1999 | Schultz | ................ H03K 17/223 327/143 |
| 2016/0033560 | A1 | * | 2/2016 | Thanner | ........... G01R 19/16552 324/764.01 |

* cited by examiner

*Primary Examiner* — Vinh P Nguyen
(74) *Attorney, Agent, or Firm* — Muncy, Geissler, Olds & Lowe, P.C.

(57) ABSTRACT

The present disclosure illustrates a low-power voltage detection circuit, including a threshold voltage detection circuit, a leakage detection circuit and a low-voltage detection circuit. By utilizing the above-mentioned threshold voltage detection circuit and leakage detection circuit, the voltage variations caused by leakage, temperature or process can be detected in the more efficient and power saving way.

14 Claims, 5 Drawing Sheets

LOW-POWER VOLTAGE DETECTION CIRCUIT

CROSS-REFERENCE TO RELATED APPLICATION

This application claims the benefit of Taiwan Patent Application No. 106130680, filed on Sep. 7, 2017, in the Taiwan Intellectual Property Office, the disclosure of which is incorporated herein in its entirety by reference.

BACKGROUND OF THE INVENTION

1. Field of the Invention

The present disclosure relates to a low-power voltage detection circuit. More particularly, the present disclosure relates to a low-power voltage detection circuit which is operated with ultra-low power consumption to precisely detect current leakage condition to ensure operation voltage.

2. Description of the Related Art

Voltage detection function is a key and necessary function for a microcontroller. Conventional voltage detection manner is hard to precisely detect the voltage drop caused by current leakage or Process-Voltage-Temperature (PVT) variation, and also has defect of high power consumption.

Furthermore, the conventional threshold voltage detection circuit is usually implemented by low-threshold-voltage transistor which is periodically turned on and off to charge a capacitor, thereby sampling and holding a voltage of a voltage source for further voltage drop detection. However, this conventional manner can detect that the voltage drop in the voltage of the voltage source exceeds the threshold voltage of the transistor, but fails to detect a slow voltage drop caused by current leakage.

Furthermore, the existing voltage detection manner usually uses a reference voltage or a divided voltage, which is derived from the voltage source, as detection reference, and keeps monitoring the voltage drop based on clock signal, and it causes significant power consumption. There is available technology for adjusting frequency of clock signal, but the voltage detection circuit turned on periodically still causes unnecessary power consumption.

Therefore, what is need is to develop a voltage detection circuit is able to detect fast and slow voltage drops precisely with low power consumption.

SUMMARY OF THE INVENTION

In order to solve aforementioned problem, the present disclosure is to provide a low-power voltage detection circuit including a voltage source, a voltage detection circuit, a threshold voltage detection circuit and a current leakage detection circuit. The voltage detection circuit is configured to sample a voltage of the voltage source when being triggered, and determine whether the voltage of the voltage source is lower than a reference voltage; and a threshold voltage detection circuit coupled to a first control terminal of the voltage detection circuit, and configured to detect whether a voltage drop in the voltage of the voltage source exceeds a threshold voltage in a sample cycle, and output a first trigger signal to trigger the voltage detection circuit when the voltage drop in the voltage of the voltage source exceeds the threshold voltage. The current leakage detection circuit includes an operation voltage circuit respectively coupled to a first switch circuit and a second switch circuit, and configured to output an operation voltage; a first capacitor coupled between the first switch circuit and a first ground; a second capacitor coupled between the second switch circuit and a second ground terminal; and a first comparator configured to compare whether a voltage difference between the voltage on the first capacitor and the second capacitor exceeds a predetermined voltage. The first comparator outputs a second trigger signal to trigger the voltage detection circuit when the voltage difference between the voltage on the first capacitor and the second capacitor exceeds a predetermined voltage. Discharge rates of the first capacitor and the second capacitor are different from each other.

In an embodiment, the threshold voltage detection circuit includes a third capacitor; a first NMOS transistor comprising a drain coupled to the voltage source, a source coupled to the third capacitor, and a gate configured to receive the clock signal, wherein the third capacitor is coupled between the source of the first NMOS transistor and a third ground terminal; a first PMOS transistor comprising a source coupled between the first NMOS transistor and the third capacitor, a gate coupled to the voltage source; and a fourth capacitor coupled between a drain of the first PMOS transistor and a fourth ground terminal. When the voltage drop in the voltage of the voltage source exceeds the threshold voltage of the first PMOS transistor, the first PMOS transistor is turned on to output the first trigger signal to trigger the voltage detection circuit.

In an embodiment, the voltage detection circuit includes: a second comparator comprises a first input terminal coupled to the voltage source, and a second input terminal configured to receive the reference voltage; a third switch circuit coupled to a control terminal of the second comparator, and configured to activate the second comparator upon receipt of the first trigger signal or the second trigger signal.

In an embodiment, the voltage detection circuit includes a low-voltage reset circuit configured to receive a third trigger signal from the second comparator, and generates a low-voltage reset signal upon receipt of the third trigger signal when the second comparator determines the voltage of the voltage source to be lower than the reference voltage.

In an embodiment, the voltage detection circuit includes a voltage divider coupled between the voltage source and the first input terminal, and configured to generate a divided voltage.

In an embodiment, the first switch circuit includes a second NMOS transistor comprising a source coupled to the operation voltage circuit, and a gate coupled to the output terminal of the first comparator; a second PMOS transistor comprising a source and a gate both coupled to a drain of the second NMOS transistor, and a drain coupled to ground. The first capacitor is coupled between the source of the second PMOS transistor and the first ground.

In an embodiment, the second switch circuit includes a third NMOS transistor comprising a source coupled to the operation voltage circuit, and a gate coupled to the output terminal of the first comparator; a third PMOS transistor comprising a source and a gate coupled to a drain of the third NMOS transistor, and a drain coupled to ground. The second capacitor is coupled between the source of the third PMOS transistor and the second ground terminal.

In an embodiment, the clock signal is the second trigger signal from the first comparator.

In an embodiment, a current leakage path of the first capacitor through the first switch circuit and a current leakage path of the second capacitor through the second switch circuit are the same as a current leakage path existed in the threshold voltage detection circuit.

In an embodiment, discharge rates of the first capacitor and the second capacitor are greater than a current leakage rate of the threshold voltage detection circuit.

In an embodiment, the first NMOS transistor is a native NMOS transistor or a zero threshold voltage NMOS transistor.

In an embodiment, a voltage of a high logic level of the clock signal is higher than the voltage of the voltage source by at least the threshold voltage of the first NMOS transistor.

In an embodiment, the low-power voltage detection circuit may include a reset switch which is controlled by the clock signal and connected in parallel with the fourth capacitor.

According to above-mentioned content, the low-power voltage detection circuit of the present disclosure can ensure that the low-voltage detection circuit can be woken up, when a certain degree of the current leakage occurs in the system, to sample the voltage of the voltage source, thereby efficiently preventing the voltage of the voltage source from being lower than the predetermined value. Furthermore, the current leakage detection circuit has the current leakage path similar with that of the threshold voltage detection circuit, and the clock signal for the threshold voltage detection circuit is replaced by the trigger signal generated by the current leakage detection circuit, thereby preventing the threshold voltage detection circuit from being woken up unnecessarily. As a result, the power consumption of the low-power voltage detection circuit of the present disclosure can be reduced.

According to an embodiment, the present disclosure provides a low-power voltage detection circuit comprising: a voltage source; a voltage detection circuit configured to sample a voltage of the voltage source when being triggered, and determine whether the voltage of the voltage source is lower than a reference voltage; a threshold voltage detection circuit coupled to a first control terminal of the voltage detection circuit, and configured to detect whether a voltage drop in the voltage of the voltage source, and output a first trigger signal to trigger the voltage detection circuit according to a detection result; and a current leakage detection circuit provided with at least two current leakage paths, and configured to output a second trigger signal to trigger the voltage detection circuit according a difference between current leakage states along the at least two current leakage paths.

The threshold voltage detection circuit in cooperation with the current leakage detection circuit can detect the voltage offset caused by current leakage or PVT (Process, Voltage and Temperature) variation in the efficient and power-saving way. Therefore, the low-power voltage detection circuit of the present disclosure can perform precise voltage drop detection with ultra-low power consumption.

BRIEF DESCRIPTION OF THE DRAWINGS

The structure, operating principle and effects of the present disclosure will be described in detail by way of various embodiments which are illustrated in the accompanying drawings.

DETAILED DESCRIPTION OF THE PREFERRED EMBODIMENTS

Figure 1:
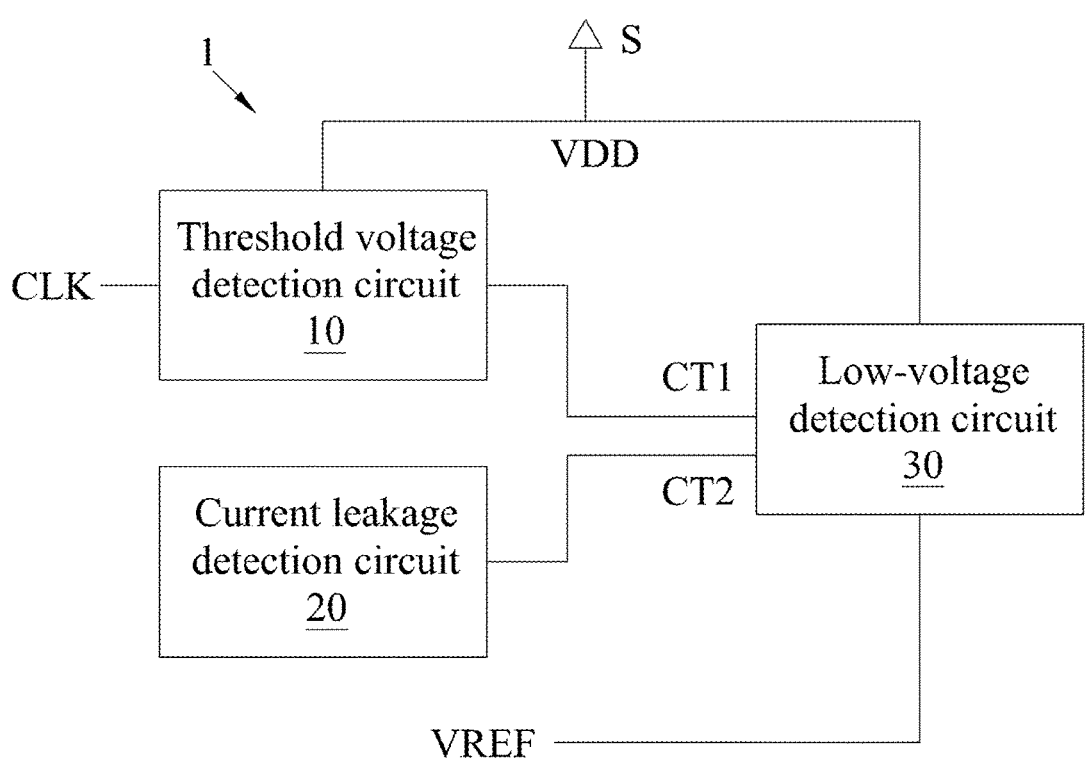
FIG. 1 is a block diagram of a first embodiment of a low-power voltage detection circuit of the present disclosure.

The following embodiments of the present disclosure are herein described in detail with reference to the accompanying drawings. These drawings show specific examples of the embodiments of the present disclosure. It is to be understood that these embodiments are exemplary implementations and are not to be construed as limiting the scope of the present disclosure in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be understood that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

The following will describe an embodiment of a low-power voltage detection circuit of the present disclosure with reference to the accompanying drawings. Please refer to FIG. 1, which is a block diagram of a first embodiment of the low-power voltage detection circuit of the present disclosure. The low-power voltage detection circuit 1 includes a voltage source S, a threshold voltage detection circuit 10, a current leakage detection circuit 20 and a low-voltage detection circuit 30. The voltage source S is configured to provide a voltage VDD. After being triggered, the current leakage detection circuit 20 samples the voltage VDD of the voltage source S, and then determines whether the voltage VDD is lower than a reference voltage VREF. In order to decrease power consumption of the low voltage detection circuit, the low-voltage detection circuit 30 is set to be closed. In an embodiment, the low-voltage detection circuit 30 can selectively sample a voltage provided to the electronic component associated with the low-voltage detection circuit 30, and detect whether the voltage VDD of the voltage source S is lower than a reference voltage VREF, thereby ensuring to maintain the minimum level of voltage required for operations of the electronic components.

In order to ensure that the low-voltage detection circuit 30 can be woken up quickly when fast voltage drop is occurred, the low-power voltage detection circuit 1 uses the threshold voltage detection circuit 10 which is electrically coupled to the voltage source S and a first control terminal CT1 of the low-voltage detection circuit 30. In a sampling cycle based on the clock signal CLK, the threshold voltage detection circuit 10 detects whether a voltage drop in the voltage VDD of the voltage source voltage is higher than a preset threshold voltage. If yes, the threshold voltage detection circuit 10 outputs a first trigger signal to the first control terminal CT1 to trigger the low-voltage detection circuit 30.

The threshold voltage detection circuit 10 is able to detect the fast voltage drop in the voltage VDD of the voltage source S, but is unable to detect slow voltage drop in the voltage VDD of the voltage source S because of current leakage. For this reason, other mechanism is need to ensure that the low-voltage detection circuit 30 can be woken up in response to a certain degree of voltage drop in the voltage VDD of the voltage source S. in an embodiment, the low-power voltage detection circuit 1 includes the current leakage detection circuit 20, and the following will describes the detail of the current leakage detection circuit 20 with reference to the accompanying drawings.

Figure 2:
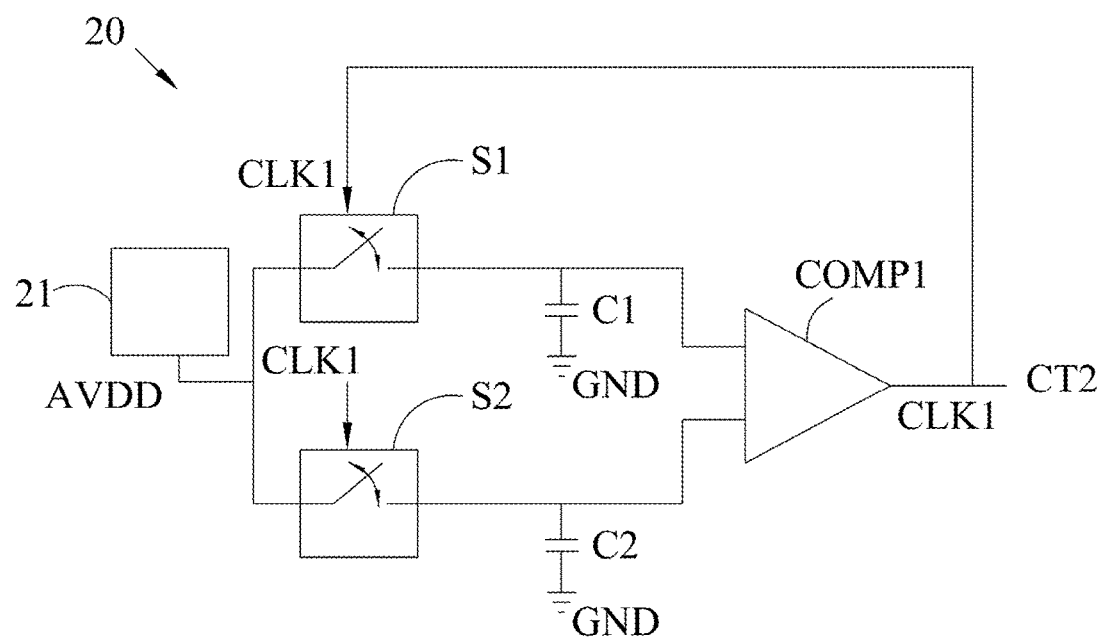
FIG. 2 is a circuit diagram of an embodiment of a current leakage detection circuit of the present disclosure.

Please refer to FIG. 2, which is a schematic view of the current leakage detection circuit of the embodiment of the present disclosure. The current leakage detection circuit 20 includes an operation voltage circuit 21, a first switch circuit S1, a second switch circuit S2, a first capacitor C1, a second capacitor C2 and a first comparator COMP1. The operation voltage circuit 21 is coupled to the first switch circuit S1 and the second switch circuit S2, and configured to output an operation voltage AVDD. The first capacitor C1 is coupled between the first switch circuit S1 and a first ground GND, and the second capacitor C2 is coupled between the second switch circuit S2 and a second ground terminal GND. The first comparator COMP1 is configured to compare and determine whether a voltage difference between the voltage on an terminal of the first capacitor C1 and the voltage on an terminal of the second capacitor C2 is higher than a predetermined voltage; if yes, the first comparator COMP1 outputs a second trigger signal CLK1 to a second control terminal CT2 of the low-voltage detection circuit 30 to trigger the low-voltage detection circuit 30. A discharge rate of the first capacitor C1 is different from that of the second capacitor C2.

More specifically, the current leakage detection circuit 20 is used to implement a clock generation circuit with ultra-low power consumption. The current leakage detection circuit 20 has working modes including an active mode and a power saving mode. In the active mode, the first switch circuit S1 and the second switch circuit S2 are turned on, and at this time, the first capacitor C1 and the second capacitor C2 are charged up to the voltage AVDD. After the first comparator COMP1 determines that the voltage difference between the voltage on an terminal of the first capacitor C1 and the voltage on an terminal of the second capacitor C2 is zero, so the first comparator COMP1 outputs a first comparison signal to turn off the first switch circuit S1 and the second switch circuit S2, and the current leakage detection circuit 20 enters the power saving mode.

In an ideal case, the voltages on the terminals of the first capacitor C1 and the second capacitor C2 are maintained at the operation voltage AVDD; however, the PMOS transistor or NMOS transistor included in the first switch circuit S1 and the second switch circuit S2 are not ideal device and may have tiny leakage current when being turned off. While the current leakage detection circuit 20 stays in the power saving mode for a while, the first capacitor C1 and the second capacitor C2 are discharging through the first switch circuit S1 and the second switch circuit S2, respectively, and it causes the voltages on the terminals of the first capacitor C1 and the second capacitor C2 decreases.

In order to response effect caused by the tiny current leakage, capacitance values of the first capacitor C1 and the second capacitor C2 of the present disclosure are set particularly to make the voltage difference correspond to the current leakage for generation of the trigger signal. The capacitance value of the first capacitor C1 can be set to be higher than that of the second capacitor C2, and the first switch circuit S1 and the second switch circuit S2 have the same leakage currents in the turn off state.

As a result, while the first capacitor C1 and the second capacitor C2 are discharging, the voltage difference between the voltages on the terminals of the first capacitor C1 and the second capacitor C2 become significant gradually. When the first comparator COMP1 compares and determines that the voltage difference between the voltages on the terminals of the first capacitor C1 and the second capacitor C2 is higher than a preset voltage, the first comparator COMP1 outputs the second trigger signal CLK1 to wake up the low-voltage detection circuit 30, and turn on the first switch circuit S1 and the second switch circuit S2 to recharge the first capacitor C1 and the second capacitor C2.

As a result, the current leakage detection circuit 20 is used to ensure that the low-voltage detection circuit 30 can be woken up to sample and monitor the voltage VDD of the voltage source S when the current leakage reaches a predetermined degree, so that the slow voltage drop in the voltage VDD can be detected and monitored.

The following describes the embodiment of the threshold voltage detection circuit with reference to the accompanying drawings. Please refer to FIG. 3, which is circuit diagram of the embodiment of the threshold voltage detection circuit of the present disclosure. The threshold voltage detection circuit 20 includes a first NMOS transistor MN1, a first PMOS transistor MP1, a third capacitor C3, a fourth capacitor C4 and a reset switch SR. The first NMOS transistor has a drain configured to receive the voltage VDD of the voltage source S, a source coupled to the third capacitor C3, and a gate configured to receive the clock signal CLK. The third capacitor C3 is coupled between the source of the first NMOS transistor and a third ground terminal GND. The first PMOS transistor MP1 includes a source coupled to the first NMOS transistor MN1 and the third capacitor C3, a gate configured to receive the voltage VDD of the voltage source S, a drain coupled to the fourth capacitor C4. The fourth capacitor C4 is coupled between the drain of the first PMOS transistor MP1 and a fourth ground terminal GND. In an embodiment, the first NMOS transistor MN1 can be a native NMOS transistor or a zero-threshold-voltage NMOS transistor. The reset switch SR is connected in parallel with the fourth capacitor C4 and controlled by the clock signal CLK. As a result, the voltage on a terminal of the fourth capacitor C4 can be maintained at the ground voltage periodically, thereby solving the problem that the voltage on the terminal of the fourth capacitor C4 may be increased because of current leakage through the first PMOS transistor MP1.

The first NMOS transistor MN1 can be turned on or off periodically to sample the voltage VDD of the voltage source S based on the clock signal CLK, so as to recharge the third capacitor C3 and maintain the voltage of the third capacitor C3 to be the voltage VDD. The first PMOS transistor MP1 has a gate configured to receive the voltage VDD, a source coupled to a first node n1 for receiving the voltage on the source of the first NMOS transistor MN1. When the voltage VDD of the voltage source S is lower than the voltage on the first node n1 and the voltage different between the voltage VDD and the voltage on the first node n1 exceeds the threshold voltage Vt of the first PMOS transistor MP1, the first PMOS transistor MP1 is turned on, so that the first trigger signal CLK2 is outputted to trigger the low-voltage detection circuit 30. For this reason, ideally the voltage of the high logic level of the clock signal CLK is higher than the voltage VDD of the voltage source S by at least the threshold voltage of the first NMOS transistor MN1, and during the sampling cycle based on the clock signal CLK, the threshold voltage detection circuit 10 wakes up the low-voltage detection circuit 30 when the threshold voltage detection circuit 10 detects that the voltage drop in the voltage VDD exceeds the threshold voltage Vt. When the voltage drop in the voltage VDD of the voltage source S exceeds the threshold voltage of the first PMOS transistor MP1, the first PMOS transistor PMOS transistor is turned on, so that the first trigger signal CLK2 is outputted to trigger the low-voltage detection circuit 30. The detection result of the threshold voltage detection circuit 10 is mainly based on the voltage on the second terminal of the fourth capacitor C4 not being coupled to the ground terminal GND, so when the voltage on the second terminal of the fourth capacitor C4 is at high logic level, it indicates that the voltage drop occurs and the first trigger signal CLK2 is outputted.

Figure 3:
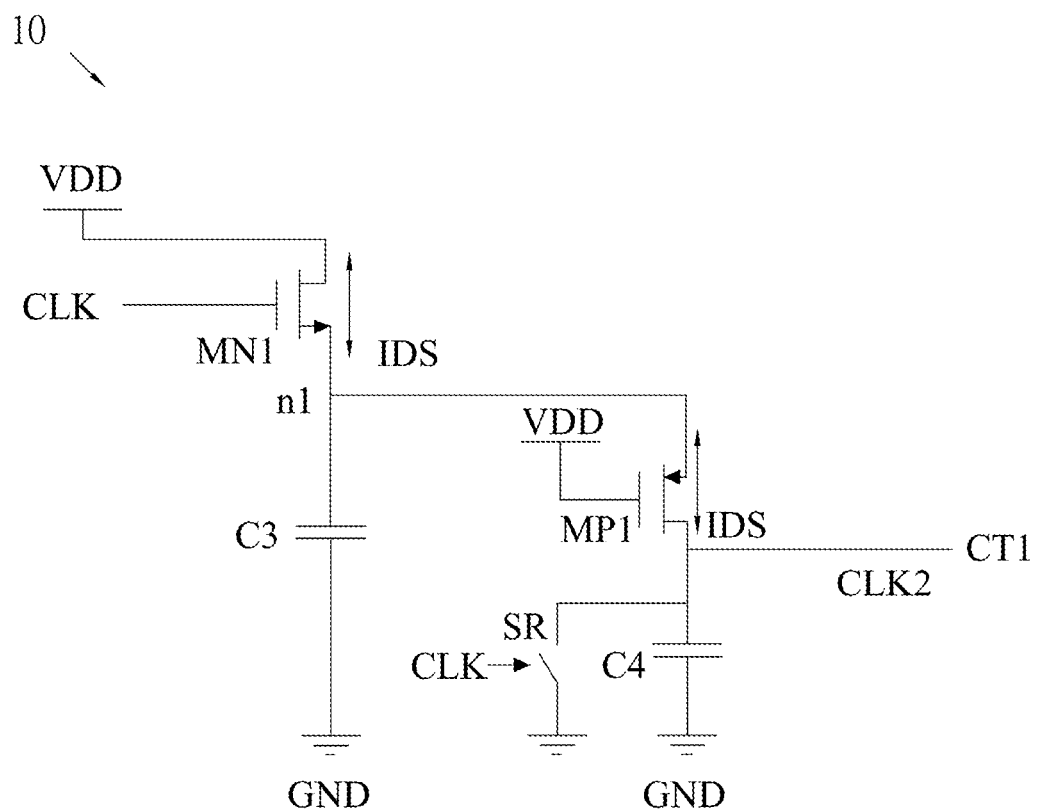
FIG. 3 is a circuit diagram of an embodiment of a threshold voltage detection circuit of the present disclosure.

It is to be noted that, in FIG. 3, the scheme for detecting the fast voltage drop is hard to detect the slow voltage drop in the voltage VDD of the voltage source voltage source due to the current leakage path IDS exists in the threshold voltage detection circuit 10, so the low-power voltage detection circuit of the present disclosure includes the current leakage detection circuit 20 for detection of the slow voltage drop in the power-saving way.

The aforementioned embodiment is able to detect the condition of leakage current in system, but the threshold voltage detection circuit 10 of the aforementioned embodiment is provided with fixed clock signal CLK and samples the voltage VDD periodically. In another embodiment, the current leakage path formed between the first switch circuit S1 and the first capacitor C1 of the current leakage detection circuit 20 and the current leakage path formed between the second switch circuit S2 and the second capacitor C2 can be designed to match with each other and the clock signal CLK is replaced by the second trigger signal CLK1, so that the threshold voltage detection circuit 10 can be woken up in the more power-saving way. The following describes the other embodiment of the current leakage detection circuit of the present disclosure with reference to drawings.

Figure 4:
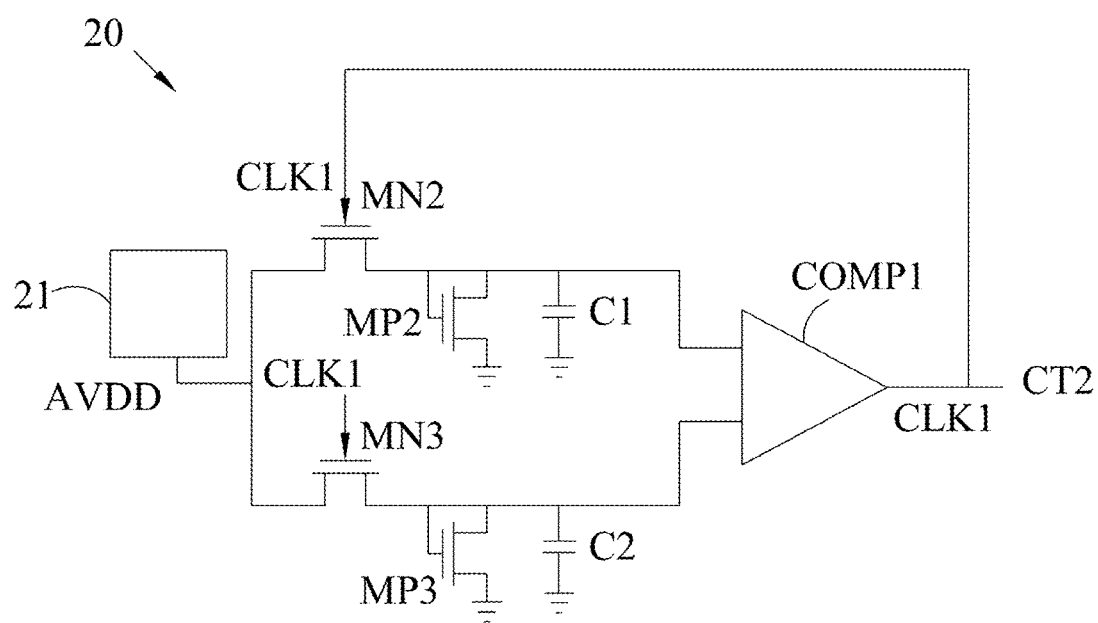
FIG. 4 is a circuit diagram of other embodiment of the current leakage detection circuit of the present disclosure.

Please refer to FIG. 4, which is a circuit diagram of the other embodiment of the current leakage detection circuit of the present disclosure. The difference between this embodiment and the previous embodiment is that the first switch circuit S1 of this embodiment includes a second NMOS transistor MN2 and a second PMOS transistor MP2. The second NMOS transistor MN2 has a source coupled to the operation voltage circuit 21 and configured to receive the operation voltage AVDD, and a gate coupled to the output terminal of the first comparator COMP1. The second PMOS transistor MP2 has a source and a gate both coupled to a drain of the second NMOS transistor MN1, and a drain coupled to ground. The first capacitor C1 is coupled between the source of the second PMOS transistor MP2 and the first ground GND.

The second switch circuit includes a third NMOS transistor MN3 and a third PMOS transistor MP3. The third NMOS transistor MN3 has a source coupled to the operation voltage circuit 21, a gate coupled to the output terminal of the first comparator COMP1. The third PMOS transistor MP3 has a source and a gate both coupled to a drain of the third NMOS transistor MN3, and a drain coupled to ground. The second capacitor C2 is coupled between the source of the third PMOS transistor MP3 and the second ground terminal GND.

In this embodiment, the configurations of the first switch circuit S1 and the second switch circuit S2 are designed to simulate the current leakage path of the threshold voltage detection circuit 10, so that the leakage current condition of the current leakage detection circuit 20 is substantially the same as that of the threshold voltage detection circuit 10, thereby decreasing the number of waking up the threshold voltage detection circuit 10 to reduce power consumption. In another embodiment, the discharge rates of the first capacitor C1 and the second capacitor C2 can be designed to be higher than the current leakage rate of the threshold voltage detection circuit 10. For example, the current leakage detection circuit of the present disclosure can be implemented by the PMOS transistor and the NMOS transistor having higher current leakage, thereby ensuring that the threshold voltage detection circuit 10 is woken up when a certain degree of current leakage occurs.

It is to note that the circuit including the first capacitor C1, the second capacitor C2, the switches S1 and S2, and the first comparator COMP1 is an example of the current leakage detection circuit, but the present disclosure is not limited thereto. The current leakage detection circuit can be implemented by any circuit provided with at least two current leakage paths, and configured to output a second trigger signal to trigger the voltage detection circuit according a difference between current leakage states along the at least two current leakage paths.

Furthermore, the threshold voltage detection circuit 10 in cooperation with the current leakage detection circuit 20 can detect the voltage offset caused by current leakage or PVT (Process, Voltage and Temperature) variation by an efficient and power-saving way. Therefore, the low-power voltage detection circuit of the present disclosure can perform voltage drop detection with ultra-low power consumption.

Figure 5:
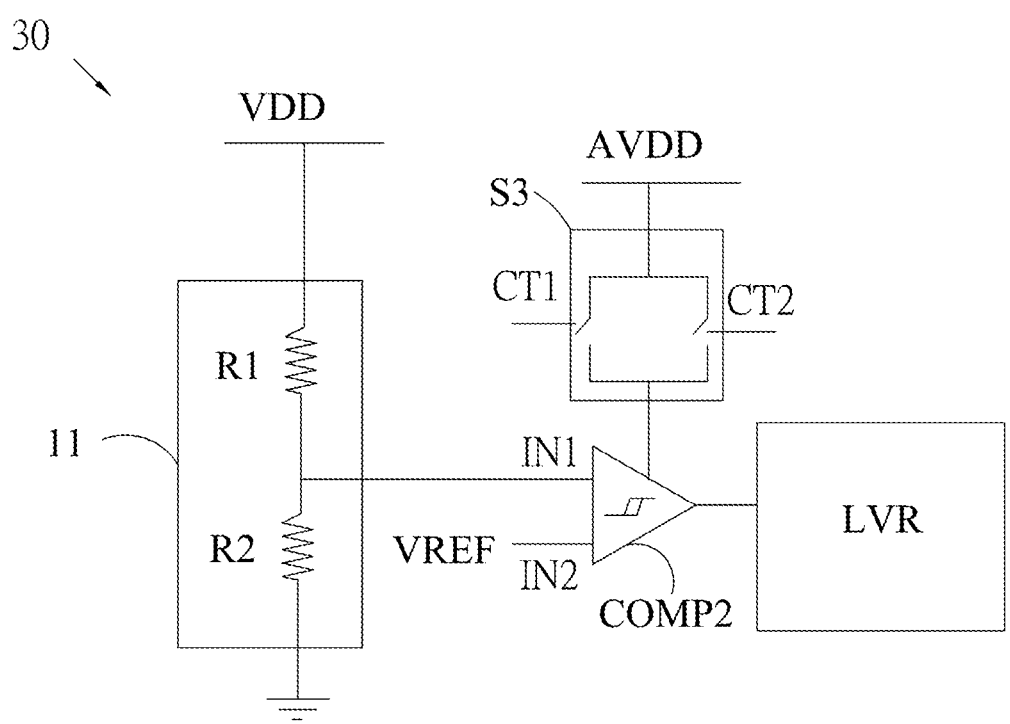
FIG. 5 is a circuit diagram of an embodiment of low-voltage detection circuit of the present disclosure.

The following describes the embodiment of the low-voltage detection circuit of the present disclosure with reference to drawings. Please refer to FIG. 5, which is a circuit diagram of an embodiment of the low-voltage detection circuit of the present disclosure.

The low-voltage detection circuit 30 includes a voltage divider 11, a third switch circuit S3, and a second comparator COMP2 including a first input terminal IN1 and a second input terminal IN2. The first input terminal IN1 can be coupled to the voltage source S directly or through the voltage divider 11 having a first resistor R1 and a second resistor R2. In the condition that the first input terminal IN1 is coupled to the voltage VDD through the voltage divider 11, the first input terminal IN1 receives a divided voltage derived from the voltage VDD of the voltage source S. The second input terminal IN2 is configured to receive the reference voltage VREF.

The third switch circuit S3 is coupled to a control terminal of the second comparator COMP2, and configured to activate the second comparator COMP2 upon receipt of the first trigger signal CLK2 or the second trigger signal CLK1. In an embodiment, the third switch circuit S3 can include two switches connected in parallel with each other, and the control terminals of the two switches are respectively coupled to the first control terminal CT1 and the second control terminal CT2. After the current leakage detection circuit 20 generates the second trigger signal CLK1, one of the two switches is turned on upon receipt of the second trigger signal CLK1, so that the second comparator COMP2 is activated to compare the sampling value of the voltage VDD of the voltage source S or the divided voltage generated by the voltage divider 11 with the reference voltage VREF, and according to a comparison result determine whether the sampling value of the voltage VDD of the voltage source S or the divided voltage generated by the voltage divider 11 is lower than the reference voltage VREF.

When the fast voltage drop in the voltage VDD of the voltage source S occurs, the first control terminal CT1 receives the first trigger signal CLK2 generated from the threshold voltage detection circuit 10, and the second comparator COMP2 is then activated to compare and determine whether the sampling value of the voltage VDD of the voltage source S or the divided voltage generated from the voltage divider 11 is lower than the reference voltage VREF. When the sampling value of the voltage VDD of the voltage source S or the divided voltage is determined to be lower than the reference voltage VREF, the second comparator COMP2 generates a third trigger signal. When the voltage source S receives the third trigger signal, the voltage source S can recover the voltage level of the voltage VDD to a predetermined voltage level.

In other implementations, the low-voltage detection circuit 30 may include a low-voltage reset circuit LVR configured to receive the third trigger signal of the second comparator and generate a low-voltage reset signal upon receipt of the third trigger signal to restart system or reset the voltage source S, thereby recovering the voltage VDD to an initial operating voltage for the system.

In other implementations, the present disclosure provides a low-power voltage detection circuit including a voltage source, a voltage detection circuit, a threshold voltage detection circuit and a current leakage detection circuit.

The voltage detection circuit is configured to sample a voltage of the voltage source when being triggered, and determine whether the voltage of the voltage source is lower than a reference voltage. The threshold voltage detection circuit is coupled to a first control terminal of the voltage detection circuit, and configured to detect whether a voltage drop in the voltage of the voltage source, and then output a first trigger signal to trigger the voltage detection circuit according to a detection result. The current leakage detection circuit is provided with at least two current leakage paths, and configured to output a second trigger signal to trigger the voltage detection circuit according a difference between current leakage states along the at least two current leakage paths.

To summarize, the low-power voltage detection circuit of the present disclosure can ensure that the low-voltage detection circuit can be woken up, when a certain degree of the current leakage occurs in the system, to sample the voltage of the voltage source, thereby efficiently preventing the voltage of the voltage source from being lower than the predetermined value. Furthermore, the current leakage detection circuit has the current leakage path similar with that of the threshold voltage detection circuit, and the clock signal for the threshold voltage detection circuit is replaced by the trigger signal generated by the current leakage detection circuit, thereby preventing the threshold voltage detection circuit from being woken up unnecessarily. As a result, the power consumption of the low-power voltage detection circuit of the present disclosure can be reduced.

The threshold voltage detection circuit in cooperation with the current leakage detection circuit can detect the voltage offset caused by current leakage or PVT (Process, Voltage and Temperature) variation in the efficient and power-saving way. Therefore, the low-power voltage detection circuit of the present disclosure can perform precise voltage drop detection with ultra-low power consumption.

The present disclosure disclosed herein has been described by means of specific embodiments. However, numerous modifications, variations and enhancements can be made thereto by those skilled in the art without departing from the spirit and scope of the disclosure set forth in the claims.

What is claimed is:

1. A low-power voltage detection circuit, comprising:
    a voltage source;
    a voltage detection circuit configured to sample a voltage of the voltage source when being triggered, and determine whether the voltage of the voltage source is lower than a reference voltage;
    a threshold voltage detection circuit coupled to a first control terminal of the voltage detection circuit, and configured to detect whether a voltage drop in the voltage of the voltage source exceeds a threshold voltage in a sample cycle, and output a first trigger signal to trigger the voltage detection circuit when the voltage drop in the voltage of the voltage source exceeds the threshold voltage; and
    a current leakage detection circuit, comprising:
        an operation voltage circuit respectively coupled to a first switch circuit and a second switch circuit, and configured to output an operation voltage;
        a first capacitor coupled between the first switch circuit and a first ground;
        a second capacitor coupled between the second switch circuit and a second ground terminal; and
        a first comparator configured to compare whether a voltage difference between the voltage on the first capacitor and the second capacitor exceeds a predetermined voltage, wherein the first comparator outputs a second trigger signal to trigger the voltage detection circuit when the voltage difference between the voltage on the first capacitor and the second capacitor exceeds a predetermined voltage,
    wherein discharge rates of the first capacitor and the second capacitor are different from each other.

2. The low-power voltage detection circuit according to claim 1, wherein the threshold voltage detection circuit comprises:
    a third capacitor;
    a first NMOS transistor comprising a drain coupled to the voltage source, a source coupled to the third capacitor, and a gate configured to receive the clock signal, wherein the third capacitor is coupled between the source of the first NMOS transistor and a third ground terminal;
    a first PMOS transistor comprising a source coupled between the first NMOS transistor and the third capacitor, a gate coupled to the voltage source; and
    a fourth capacitor coupled between a drain of the first PMOS transistor and a fourth ground terminal;
    wherein when the voltage drop in the voltage of the voltage source exceeds the threshold voltage of the first PMOS transistor, the first PMOS transistor is turned on to output the first trigger signal to trigger the voltage detection circuit.

3. The low-power voltage detection circuit according to claim 2, wherein the first NMOS transistor is a native NMOS transistor or a zero threshold voltage NMOS transistor.

4. The low-power voltage detection circuit according to claim 2, wherein a voltage of a high logic level of the clock signal is higher than the voltage of the voltage source by at least the threshold voltage of the first NMOS transistor.

5. The low-power voltage detection circuit according to claim 2, further comprising a reset switch which is controlled by the clock signal and connected in parallel with the fourth capacitor.

6. The low-power voltage detection circuit according to claim 1, wherein the voltage detection circuit comprises:
   a second comparator comprises a first input terminal coupled to the voltage source, and a second input terminal configured to receive the reference voltage; and
   a third switch circuit coupled to a control terminal of the second comparator, and configured to activate the second comparator upon receipt of the first trigger signal or the second trigger signal.

7. The low-power voltage detection circuit according to claim 6, wherein the voltage detection circuit comprises a low-voltage reset circuit configured to receive a third trigger signal from the second comparator, and generates a low-voltage reset signal upon receipt of the third trigger signal when the second comparator determines the voltage of the voltage source to be lower than the reference voltage.

8. The low-power voltage detection circuit according to claim 6, wherein the voltage detection circuit includes a voltage divider coupled between the voltage source and the first input terminal, and configured to generate a divided voltage.

9. The low-power voltage detection circuit according to claim 1, wherein the first switch circuit comprises:
   a second NMOS transistor comprising a source coupled to the operation voltage circuit, and a gate coupled to the output terminal of the first comparator; and
   a second PMOS transistor comprising a source and a gate both coupled to a drain of the second NMOS transistor, and a drain coupled to ground;
   wherein the first capacitor is coupled between the source of the second PMOS transistor and the first ground.

10. The low-power voltage detection circuit according to claim 1, wherein the second switch circuit comprises:
    a third NMOS transistor comprising a source coupled to the operation voltage circuit, and a gate coupled to the output terminal of the first comparator; and
    a third PMOS transistor comprising a source and a gate coupled to a drain of the third NMOS transistor, and a drain coupled to ground,
    wherein the second capacitor is coupled between the source of the third PMOS transistor and the second ground terminal.

11. The low-power voltage detection circuit according to claim 1, wherein the clock signal is the second trigger signal from the first comparator.

12. The low-power voltage detection circuit according to claim 1, wherein a current leakage path of the first capacitor through the first switch circuit and a current leakage path of the second capacitor through the second switch circuit are the same as a current leakage path existed in the threshold voltage detection circuit.

13. The low-power voltage detection circuit according to claim 1, wherein discharge rates of the first capacitor and the second capacitor are greater than a current leakage rate of the threshold voltage detection circuit.

14. A low-power voltage detection circuit, comprising:
    a voltage source;
    a voltage detection circuit configured to sample a voltage of the voltage source when being triggered, and determine whether the voltage of the voltage source is lower than a reference voltage;
    a threshold voltage detection circuit coupled to a first control terminal of the voltage detection circuit, and configured to detect whether a voltage drop in the voltage of the voltage source, and output a first trigger signal to trigger the voltage detection circuit according to a detection result; and
    a current leakage detection circuit provided with at least two current leakage paths, and configured to output a second trigger signal to trigger the voltage detection circuit according a difference between current leakage states along the at least two current leakage paths.

* * * * *